United States Patent [19]
Haviland et al.

[11] Patent Number: 5,317,251
[45] Date of Patent: May 31, 1994

[54] PEAK MAGNETIC FIELD DETECTOR WITH NON-VOLATILE STORAGE

[75] Inventors: Jeffrey S. Haviland, Plymouth; Donald R. Krahn, Eagan; Robert W. Schneider, Bloomington, all of Minn.

[73] Assignee: Honeywell Inc., Minneapolis, Minn.

[21] Appl. No.: 979,950

[22] Filed: Nov. 23, 1992

[51] Int. Cl.⁵ ...................... G01R 19/00; G11B 5/127
[52] U.S. Cl. .................................... 324/102; 360/113
[58] Field of Search .................... 360/113; 324/102

[56] References Cited

U.S. PATENT DOCUMENTS

| | | | |
|---|---|---|---|
| 4,180,775 | 12/1979 | Hsieh | 324/249 |
| 4,290,014 | 9/1981 | Tremaine | 324/77 |
| 4,716,364 | 12/1987 | Guilford et al. | 324/127 |

OTHER PUBLICATIONS

Military & Aerospace Electronics, vol. 3, No. 3, May 1992 "TRW Device Promises to Cut Test and Monitoring Costs" by Charlotte Adams, 2 pages.
Aviation Week & Space Technology, Apr. 20, 1992 "New Integrated Circuit Disc Allows No-Connection Monitoring" by Bruce D. Nordwall, 1 page.

Primary Examiner—Kenneth A. Wieder
Assistant Examiner—Barry Charles Bowser
Attorney, Agent, or Firm—Gregory A. Bruns

[57] ABSTRACT

A peak current detecting and non-volatile storage device has a substrate having a hole. Individual magnetic field detecting elements are located on the substrate and are radially displaced from the hole. A conductor extends through the hole. The magnetic field detecting elements are magnetized to a predetermined state. Current carried by the conductor creates a magnetic field around the conductor which alters the predetermined state of magnetization of the magnetic field detecting devices. Various readout techniques may be used to determine the altered state of magnetization which is representative of the magnetic field and may be easily related to the current.

20 Claims, 1 Drawing Sheet 5,317,251

PEAK MAGNETIC FIELD DETECTOR WITH NON-VOLATILE STORAGE

BACKGROUND OF THE INVENTION

The present invention relates generally to magnetic field sensing devices and more specifically to peak magnetic field sensing devices which include non volatile storage of the peak magnetic field strength.

There are many situations where there is a need to measure and hold the value of a peak magnetic field which occurred during a given time period. One example is the need to measure and record or store the maximum electrical current flowing through a conductor during a given time interval. The current to be measured may also consist of only a current pulse of very short duration. The need includes the requirement that this measuring and holding of the current value be accomplished with a minimal change in the current, minimal change in the wiring and minimal change in the transmission characteristics or impedance of the conductor.

In the past, one approach to this need has been to cut the conductor and insert a resistor so that the current to be measured passes through the resistor causing a resulting voltage drop. In some instances the insertion of the resistor can be accomplished at a circuit connector. The voltage across the resistor is then measured, for example with a voltmeter, and since the voltage drop is proportional to the current in the conductor the current can then be determined. This approach is invasive in that it physically changes the circuit and the impedance of the current path. In addition this approach requires that there be space available for the resistor insertion and voltmeter arrangement. In actual practice, the need for current measurement in systems frequently exists when there is simply not sufficient space available for the resistor and voltmeter in the system.

Another approach to measuring and holding the value of a current involves placing an inductive pickup consisting of one loop or of many loops around the current carrying conductor and measuring the induced voltage in this pickup. By integrating this induced voltage over time, the current in the conductor can be determined.

The resistor insertion approach and the inductive pickup approach have shortcomings. The resistor insertion approach requires that a voltage be measured. The inductive pickup approach requires that the voltage be measured and stored as a function of time. These requirements become more difficult when for example the voltage occurs as a short pulse. Also, in many practical applications the data storage equipment is necessarily at some distance from the current measurement point.

Magnetic sensors are another prior approach to current measurement. Hall effect sensors for example can use a Hall element constructed from a thin sheet of conductive material with output connections perpendicular to the direction of current flow through the element. When subjected to a magnetic field normal to the element, as provided by the current to be measured in a nearby conductor, the element responds with an output voltage proportional to the magnetic field strength. The voltage output is very small and requires additional electronics, either on or off chip, to achieve useful voltage levels as well as to provide the excitation current through the element and storage of the acquired information.

Magnetoresistive sensors may also be used for current measurement. Materials such as permalloy can be given a preferred magnetic orientation by application of an external field, which may be supplied by a nearby current strap. If a magnetic field is then applied perpendicular to the current and in the plane of the permalloy thin film material, the direction of magnetization will rotate toward the direction of the magnetic field. The angle through which the magnetization direction rotates depends on the amplitude of the external field produced by the current to be measured. The resistance of the permalloy element decreases as the direction of magnetization rotates away from the direction in which the current in the magnetoresistive element flows, and this resistance change is representative of the magnetic field due to the current to be measured. Magnetoresistive sensors require electrical power to provide the current in the sensor and will require signal conditioning and readout electronics.

Also, fluxgate magnetometers as well as other types of magnetometers have been used to measure currents. However all of these approaches require separate signal conditioning and storage circuitry.

Thus a need exists for simple non-invasive current sensing and storage capability.

SUMMARY OF THE INVENTION

The present invention solves these and other needs by providing a peak magnetic field sensing device for sensing the peak magnetic field provided by a current in a conductor. Magnetic field detecting elements are located on a substrate. A conductor extends through a hole in the substrate and is generally perpendicular to the substrate or the conductor is near the substrate and parallel or perpendicular to the substrate. The magnetic field detecting elements have a predetermined state of magnetization and are radially displaced from the hole or current (field) source. A current in the conductor causes a magnetic field which alters the predetermined state of magnetization of the magnetic field detecting elements. A readout method is used to determine the altered state of magnetization which is representative of the peak magnetic field and can be directly related to the peak current.

DESCRIPTION OF THE PREFERRED EMBODIMENT

Figure 1:
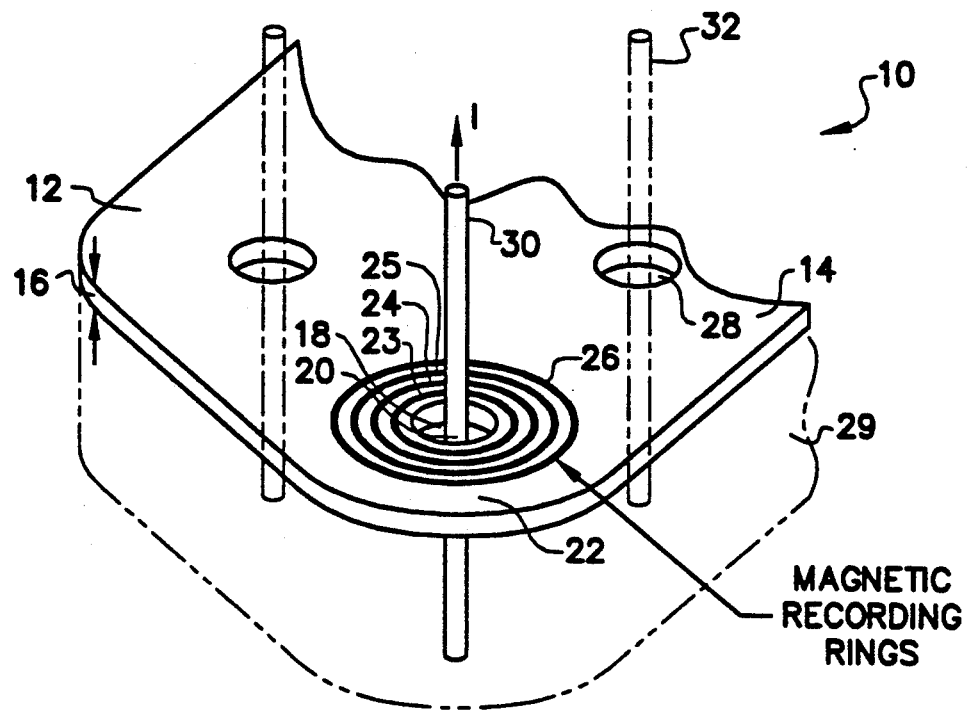
FIG. 1 shows a partial perspective view of a peak magnetic field detector and storage device according to the teachings of the present invention with portions being shown in phantom.

A peak magnetic field sensing device for measuring and storing the peak magnetic field due to a current I flowing in a conductor is shown in the drawings and is generally designated 10.

In the form shown in FIG. 1, device 10 according to the teachings of the present invention includes a substrate 12. Substrate 12 may be of silicon, glass, ceramic or other suitable material. For purposes of the discussion herein it will be assumed that substrate 12 is silicon. Substrate 12 has a surface 14 and a thickness 16 which is not critical. Substrate 12 also has a hole 18 having a center 20. In accordance with a first embodiment of the present invention, a thin film magnetic material is patterned into a series of concentric circle rings 22, on surface 14 of silicon substrate 12. Rings 22 surround hole 18 and include individual rings 23, 24, 25, and 26. Hole 28 is a second hole that may be required for example if device 10 is designed to fit over the pins of an electrical connector 29. Conductor 30 extends through hole 18 in substrate 12. Ideally conductor 30 is arranged to pass through center 20 of hole 18 and to be perpendicular to substrate 12 Conductor 30 may be a pin of connector 29 and conductor 32 may be a second pin of connector 29.

Now that the basic construction of device 10 has been disclosed, the method of use and subtle features can be set forth and appreciated. As shown in FIG. 1 a thin film magnetic material in the form of rings 22 has been placed in the vicinity of conductor 30. Device 10 has been shaped or formed so that it will fit over pins 30 and 32 and between connector portion 29 and a second connector portion which is not shown. Initially, the magnetic material of rings 22 may either be completely demagnetized or magnetized in some initial known orientation, for example opposite from the magnetization directions which would be caused by the current I to be measured. This initial magnetization in an opposite direction could be caused, for example by causing an initialization current to flow in conductor 30 in a direction opposite to current I which is the current to be measured. If the initialization is sufficiently large, all of rings 22 will be magnetized in either a clockwise or a counterclockwise direction depending on the direction of the initialization current.

The magnetic field strength near a conductor as a function of the current in the conductor is well known for many geometries and can be calculated for essentially all geometries. Therefore it is easily seen that when current I flows in conductor 30, the peak magnetic field due to current I will be recorded by the thin film magnetic material which is in the form of rings 22.

The geometry of the concentric rings 22, for example the thickness of the thin film, width of the rings 22, radius of the rings 22 and other geometrical characteristics along with magnetic properties of the thin films such as coercivity, anisotropy, squareness ratios and other magnetic properties will determine how the magnetization in each of rings 23, 24, 25, and 26 will switch when a magnetic field due to current I in conductor 30 is present. Thus the designer of a device 10, by properly selecting these parameters can design a device which will have an output, i.e., the number of rings 22 in which the magnetization has switched be an appropriate function of the input current. That is the output may be designed to be linearly proportional, logarithmically proportional or some other appropriate function of the input. The embodiment shown in FIG. 1 having rings 22 completely encircling conductor 30 will, to first order, not be sensitive to either current carrying conductor 30 being offset from center 20 of hole 18 or to uniform ambient magnetic fields.

The readout of the magnetic field information recorded in concentric rings 22 can be achieved in a variety of ways. For example, one method is to use the magneto-optic Kerr effect. Either the polar, longitudinal or transverse Kerr effect in which polarized light is made to be incident on the magnetic thin films can be used. Depending on the direction of the magnetization of the thin films for rings 22, the polarization of the incident light will be rotated differing amounts. This readout method could be done by scanning a small beam of polarized light across the thin film or by using a scanning Kerr microscope system which makes a simultaneous image of the entire thin film area. The technologies associated with the readout methods described hereinbefore are well known and will not be further described. The goal of any of the readout approaches is to determine which of the thin film magnetic rings 22 have magnetically switched due to current I in conductor 30. Another readout approach would be to use a method similar to those used to detect magnetization in a magnetic core memory element.

Figure 2:
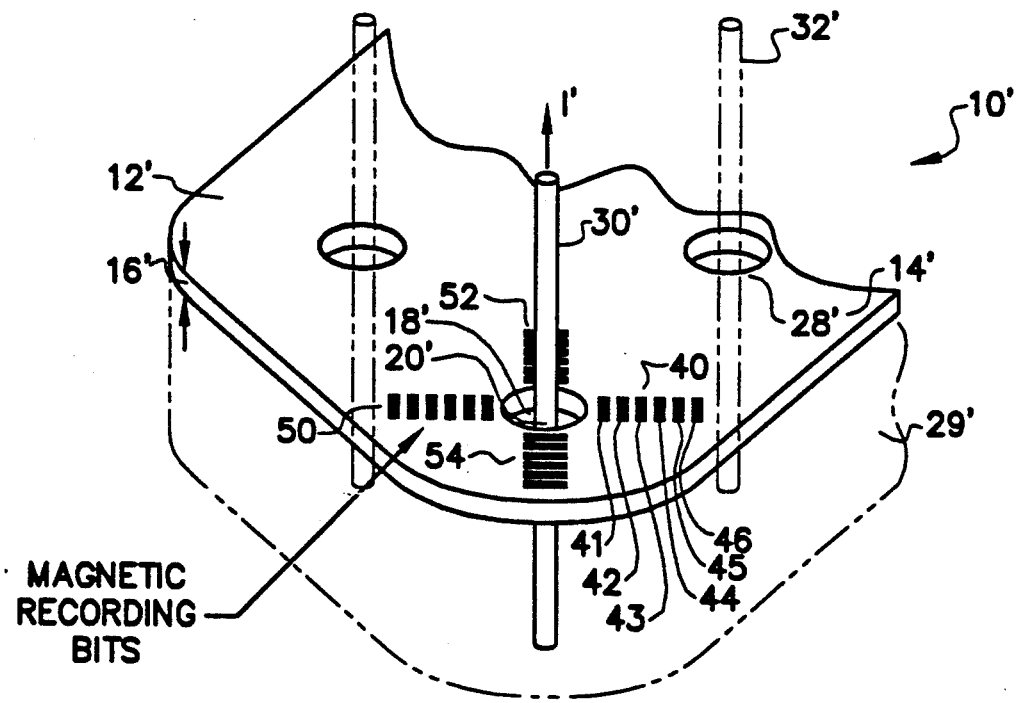
FIG. 2 shows a partial perspective view of an alternate embodiment of a peak magnetic field detector and storage device with portions being shown in phantom.

An alternate embodiment of device 10 is shown in FIG. 2 where elements corresponding to elements of FIG. 1 are designated, for example, substrate 12'. In FIG. 2 a series of magnetic elements 40 made up of individual magnetic elements 41, 42, 43, 44, 45, and 46 which are patterned on substrate 12'. Series 40 is patterned in a radial row 48 extending away from conductor 30' so that they will be switched by current in conductor 30'. A single radial row 40 can be used to detect the peak current in conductor 30'. A second opposing radial row 50 is also shown in FIG. 2. By having two or more opposing rows the readout values of the two opposing rows can be averaged to remove the effects of the ambient field in the plane of substrate 12. An additional two opposing rows 52 and 54 can also be used so that four rows are available for the averaging of the opposing rows to remove the effect of the in plane ambient field. Device 10 can also be designed to have additional opposing rows so that there will be one set of opposing rows which will have zero ambient field along the switching direction in the plane of substrate 12'. These opposing rows would therefore have the least switching effects due to ambient fields.

In the alternate embodiment of FIG. 2 the setting of the initial magnetization direction in for example, series of magnetic sensing elements 40, the switching of the magnetic elements, and the readout would be performed in the same general way as described for the embodiment of FIG. 1.

Now that the construction and operation of device 10 have been set forth, certain advantages can be further set forth and appreciated. In the past, the measurement and recording of peak current values in many systems has been difficult due to space and weight limitations of the systems, the need to measure and record the current with minimum disturbance of the circuit in which current is being measured, complexity of instrumentation located remote from the point of measurement and other considerations. Through the use of device 10 the peak current in a circuit can be measured in a non-invasive way and the peak value stored in non-volatile storage.

Device 10 is particularly suited to the measurement and recording of a short pulse of current as required in analyzing single event situations.

Also, device 10 can be used in applications requiring measurement of either direct current or alternating current.

The present invention has been described herein for the particular application of measuring and holding a peak value of current flowing in a conductor. However, it is to be understood that the present invention of a peak magnetic field detector with non-volatile storage has many other applications and is not to be limited to device 10. Similarly while device 10 was described in terms of thin-film magnetic elements it is understood that non-thin-film magnetic elements may also be used. By way of example, but not by way of limitation, thick magnetic film, bulk magnetic material, and particulate magnetic materials may be used.

In accordance with the foregoing description, applicants have developed a simple peak magnetic field measuring and storage device that can be utilized in many applications. Although a specific embodiment of applicants invention is shown and described for illustrative purposes, a number of modifications will be apparent to those of ordinary skill in the relevant arts. It is not intended that coverage be limited to the disclosed embodiments, but only by the terms of the following claims.

What is claimed is:

1. Device for detecting a magnetic field and storing the value of said magnetic field, said device comprising:
    a substrate;
    individual magnetic field detecting elements spatially distributed at fixed locations on said substrate, said individual magnetic field detecting elements being in a predetermined first state of magnetization prior to exposure to said magnetic field;
    means for exposing said individual elements to said magnetic field, said magnetic field altering said predetermined first state of magnetization in at least one of said individual magnetic field detecting elements to a second state of magnetization, said second state of magnetization being representative of said value of said magnetic field.

2. Device of claim 1 further comprising a hole extending through said substrate.

3. Device of claim 1 wherein said magnetic field is provided by a conductor carrying a first current, said conductor extending through said hole.

4. Device of claim 3 wherein said conductor is substantially perpendicular to said substrate.

5. Device of claim 4 wherein said second state of magnetization is representative of said first current.

6. Device of claim 1 wherein said predetermined first state of magnetization is established by passing a predetermined current through said conductor.

7. Device of claim 4 wherein said magnetic elements are in the form of concentric rings surrounding said hole.

8. Device of claim 4 wherein said magnetic sensing elements are discrete, radially displaced elements.

9. Device of claim 9 wherein said discrete radially displaced elements are formed in a first row extending in a first direction from said hole.

10. Device of claim 9 further comprising discrete radially displaced elements formed in a second row extending in a second direction from said hole, said second direction being opposite said first direction.

11. Device of claim 7 wherein said substrate is shaped to fit over pins of an electrical connector.

12. Device of claim 8 wherein said substrate is shaped to fit over pins of an electrical connector.

13. Device for detecting a magnetic field due to a current in an electrical conductor and storing the value of said magnetic field, said device comprising:
    a substrate having a hole therethrough, said electrical conductor extending through said hole, said electrical conductor substantially perpendicular to said substrate;
    individual magnetic field detecting elements spatially distributed at fixed locations on said substrate, said individual magnetic field detecting elements being in a predetermined first state of magnetization prior to exposure to said magnetic field;
    said magnetic field altering said predetermined first state of magnetization in at least one of said individual magnetic field detecting elements to a second state of magnetization, said second state of magnetization being representative of said value of said magnetic field and said current.

14. Device of claim 13 wherein said predetermined first state of magnetization is established by passing a predetermined current through said conductor.

15. Device of claim 14 wherein said magnetic elements are in the form of concentric rings surrounding said hole.

16. Device of claim 14 wherein said magnetic sensing elements are discrete radially displaced elements.

17. Device of claim 16 wherein said discrete radially displaced elements are formed in a first row extending in a first direction from said hole.

18. Device of claim 17 further comprising discrete radially displaced elements formed in a second row extending in a second direction from said hole, said second direction being opposite said first direction.

19. Device of claim 15 wherein said substrate is shaped to fit over pins of an electrical connector.

20. Device of claim 16 wherein said substrate is shaped to fit over pins of an electrical connector.

* * * * *